(12) United States Patent
Lee et al.

(10) Patent No.: US 9,136,018 B2
(45) Date of Patent: Sep. 15, 2015

(54) INTERNAL VOLTAGE GENERATION CIRCUITS

(71) Applicant: SK hynix Inc., Icheon-si Gyeonggi-do (KR)

(72) Inventors: Jae Wook Lee, Icheon-si (KR); Chang Ho Do, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 288 days.

(21) Appl. No.: 13/846,691

(22) Filed: Mar. 18, 2013

(65) Prior Publication Data

US 2014/0145690 A1 May 29, 2014

(30) Foreign Application Priority Data

Nov. 28, 2012 (KR) .................. 10-2012-0136390

(51) Int. Cl.
G11C 7/00 (2006.01)
G11C 29/02 (2006.01)
G11C 5/14 (2006.01)

(52) U.S. Cl.
CPC .............. *G11C 29/028* (2013.01); *G11C 5/147* (2013.01); *G11C 29/021* (2013.01)

(58) Field of Classification Search
CPC ...... G11C 29/50; G11C 11/401; G11C 29/202
USPC ................. 365/201, 226, 189.07, 189.09
See application file for complete search history.

(56) References Cited

U.S. PATENT DOCUMENTS 7,539,072 B2 * 5/2009 Kang ............................. 365/201
7,606,099 B2 * 10/2009 Chung ........................ 365/211

FOREIGN PATENT DOCUMENTS

KR          1020090001245 A         1/2009

* cited by examiner

*Primary Examiner* — Son Dinh
(74) *Attorney, Agent, or Firm* — William Park & Associates Ltd.

(57) ABSTRACT

An internal voltage generation circuit includes a reference voltage generator and an internal voltage generator. The reference voltage generator is configured to adjust resistance values according to test signals and to generate an upper limit reference voltage and a lower limit reference voltage whose levels are determined according to the resistance values. The internal voltage generator is configured to generate an internal voltage which is driven according to the levels of the upper and lower limit reference voltages.

18 Claims, 5 Drawing Sheets

INTERNAL VOLTAGE GENERATION CIRCUITS

CROSS-REFERENCES TO RELATED APPLICATIONS

The present application claims priority under 35 U.S.C 119(a) to Korean Application No. 10-2012-0136390, filed on Nov. 28, 2012, in the Korean Intellectual Property Office, which is incorporated herein by reference in its entirety as set forth in full.

BACKGROUND

Embodiments of the present disclosure relate generally to semiconductor integrated circuits and, more particularly, to internal voltage generation circuits.

In general, various internal voltages for operating the internal circuits of a semiconductor memory device are generated internally based on the external voltages, for example, a power supply voltage VDD and a ground voltage VSS. The internal voltages for operating the internal circuits of the semiconductor memory device include: a core voltage VCORE provided to a memory core region; a high voltage VPP used to drive or overdrive the word lines; and a back-bias voltage VBB provided to a bulk region (or a substrate) of the NMOS transistors in the memory core region.

The internal voltages to operate the internal circuits of the semiconductor memory device also include: a cell plate voltage VCP provided to a plate node of cell capacitors in the memory core region; and a bit line pre-charge voltage VBLP used to pre-charge the bit lines. The cell plate voltage VCP and the bit line pre-charge voltage VBLP may be generated from the core voltage VCORE and may be generated to have a half level of the core voltage VCORE for minimization of power consumption.

The cell plate voltage VCP and the bit line pre-charge voltage VBLP may be generated from a single internal voltage generation circuit. In the conventional internal voltage generation circuits, driving the internal voltage (e.g., the cell plate voltage VCP or the bit line pre-charge voltage VBLP) may be ended when the cell plate voltage VCP or the bit line pre-charge voltage VBLP has a half level of the core voltage VCORE. In contrast, the cell plate voltage VCP (or the bit line pre-charge voltage VBLP) may be driven when a level of the cell plate voltage VCP (or the bit line pre-charge voltage VBLP) is higher or lower than a half level of the core voltage VCORE. When the internal voltage (e.g., the cell plate voltage VCP or the bit line pre-charge voltage VBLP) is not driven, the internal voltage generation circuit may be referred to as being in a dead zone.

The conventional internal voltage generation circuits have been configured to compare an internal voltage (e.g., the cell plate voltage VCP or the bit line pre-charge voltage VBLP) with a plurality of reference voltages to drive the internal voltage. In such a case, when the internal voltage has a level between an upper reference voltage and a lower reference voltage, the conventional internal voltage generation circuits may be in a dead zone that the internal voltage is not driven.

A voltage difference between the upper and lower reference voltages may be reduced due to variations of some conditions, for example, processes, voltages and/or temperatures (PVT). If the voltage difference between the upper and lower reference voltages is reduced, a range of the dead zone may be narrowed to increase the power consumption of the internal voltage generation circuits.

SUMMARY

Various embodiments are directed to internal voltage generation circuits.

According to some embodiments, an internal voltage generation circuit includes a reference voltage generator and an internal voltage generator. The reference voltage generator is configured to adjust resistance values according to test signals and to generate an upper limit reference voltage and a lower limit reference voltage whose levels are determined according to the resistance values. The internal voltage generator is configured to generate an internal voltage which is driven according to the levels of the upper and lower limit reference voltages.

According to further embodiments, an internal voltage generation circuit includes a test signal generator, a voltage divider, and a selection transmitter. The test signal generator is configured to generate first and second voltage control test signals to set resistance values used in division of a power supply voltage and to generate first and second dead zone control test signals for setting a dead zone window in which an internal voltage is not driven. The voltage divider is configured to divide the power supply voltage using the resistance values set by the first and second voltage control test signals and to generate first to fourth divided voltages. The selection transmitter is configured to output one of the first and second divided voltages as an upper limit reference voltage and to output one of the third and fourth divided voltages as a lower limit reference voltage, in response to the first and second dead zone control test signals.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments of the inventive concept will be described hereinafter with reference to the accompanying drawings. However, the example embodiments described herein are for illustrative purposes and not intended to limit the scope of the inventive concept.

Figure 1:
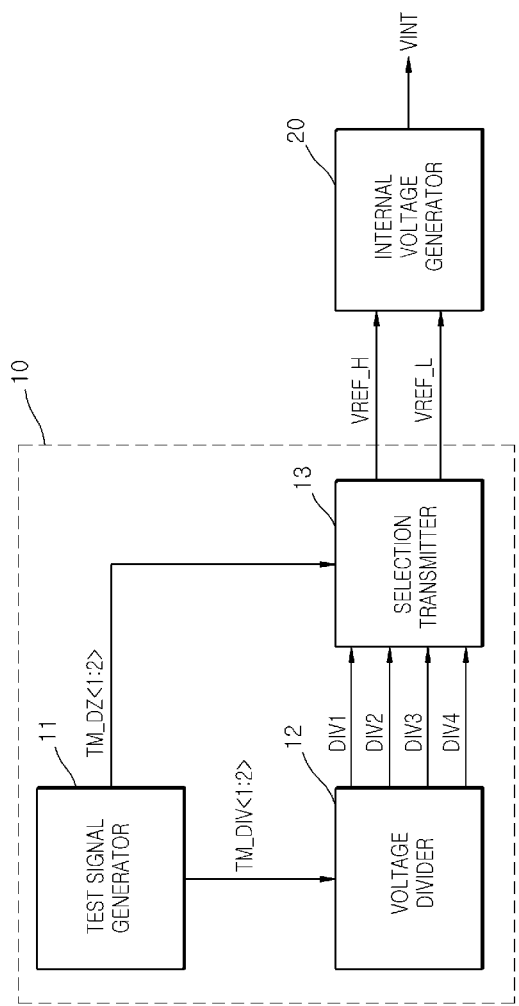
FIG. 1 is a block diagram illustrating a configuration of an internal voltage generation circuit according to an example embodiment.

FIG. 1 is a block diagram illustrating a configuration of an internal voltage generation circuit according to an embodiment of the present invention.

As illustrated in FIG. 1, an internal voltage generation circuit according to an embodiment of the present invention may be configured to include a reference voltage generator 10 and an internal voltage generator 20. The reference voltage generator 10 may be configured to adjust the resistance values based on the test signals and to generate an upper limit reference voltage VREF_H and a lower limit reference voltage VREF_L whose levels are determined according to the resistance values. The internal voltage generator 20 may be configured to generate an internal voltage VINT which is driven according to levels of the upper and lower limit reference voltages VREF_H and VREF_L.

The reference voltage generator 10 may be configured to include a test signal generator 11, a voltage divider 12, and a selection transmitter 13. The test signal generator 11 may be configured to generate first and second voltage control test signals TM_DIV<1:2> to set resistance values of resistors used in division of a power supply voltage VDD and to generate first and second dead zone control test signals TM_DZ<1:2> for setting a dead zone window in which an internal voltage VINT is not driven. The voltage divider 12 may divide the power supply voltage VDD with the resistance values, which are set by the first and the second voltage control test signals TM_DIV<1:2>, to generate a plurality of divided voltages. For example, a first divided voltage to a fourth divided voltage DIV1, DIV2, DIV3, and DIV4 are shown in FIG. 1. The selection transmitter 13 may output one of the first and the second divided voltages DIV1 and DIV2 as the upper limit reference voltage VREF_H and may output one of the third and the fourth divided voltages DIV3 and DIV4 as the lower limit reference voltage VREF_L, in response to the first and the second dead zone control test signals TM_DZ<1:2>.

A configuration of the voltage divider 12 will be described more fully hereinafter with reference to FIG. 2.

Figure 2:
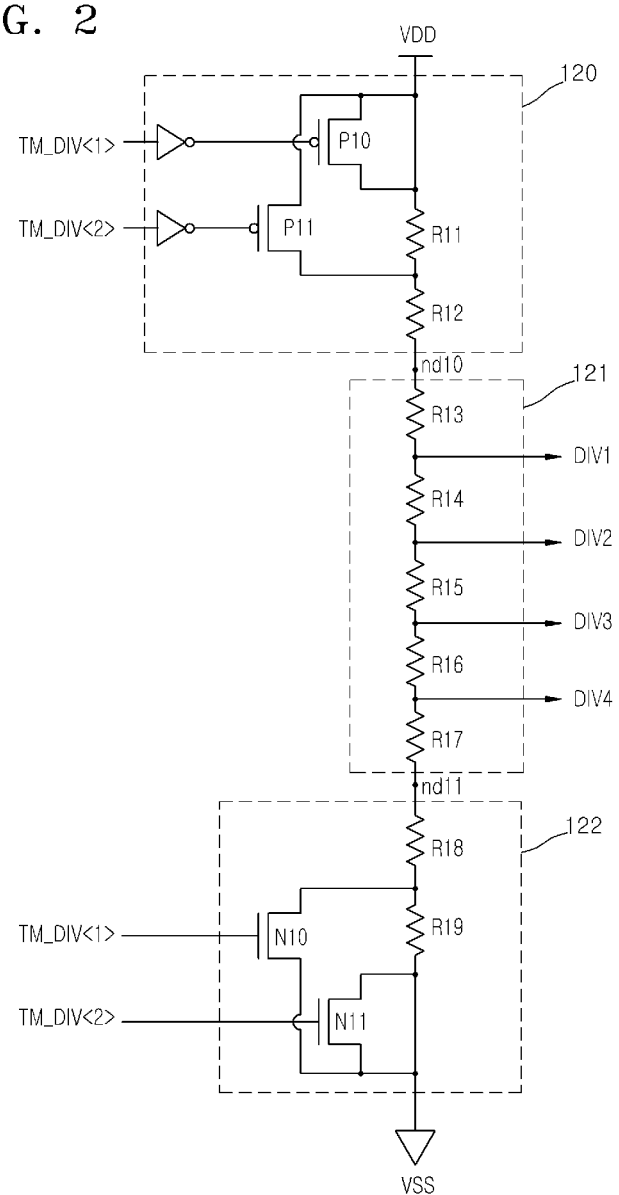
FIG. 2 is a circuit diagram illustrating a voltage divider included in the internal voltage generation circuit shown in FIG. 1.

Referring to FIG. 2, the voltage divider 12 may be configured to include a first voltage divider 120, a second voltage divider 121, and a third voltage divider 122.

The first voltage divider 120 may be disposed between a power source and a first node ND10. That is, one terminal of the first voltage divider 120 may be electrically connected to the power source generating the power supply voltage VDD and another terminal of the first voltage divider 120 may be electrically connected to the first node ND10. Further, the first voltage divider 120 may be configured to include a first resistor R11, a second resistor R12, a first PMOS transistor P10, and a second PMOS transistor P11. The first and second resistors R11 and R12 may be connected in series between the power supply voltage terminal VDD and the first node ND10, and the second PMOS transistor P11 may be electrically connected to the first resistor R11 in parallel. The source and drain terminals of the first PMOS transistor P10 may be tied to each other and may be electrically connected to the power supply voltage terminal VDD. In addition, the input terminals (e.g., gates) of the first and the second PMOS transistors P10 and P11 may receive the first and the second voltage control test signals TM_DIV<1:2> respectively through inverters. The first voltage divider 120 may turn on one of the first and the second PMOS transistors P10 and P11 in response to a combination of logic levels of the first and the second voltage control test signals TM_DIV<1:2>, thereby controlling a resistance value between the power supply voltage terminal VDD and the first node ND10. For example, when the first voltage control test signal TM_DIV<1> has a logic "high" level and the second voltage control test signal TM_DIV<2> has a logic "low" level, the first PMOS transistor P10 may be turned on and the second PMOS transistor P11 may be turned off. Thus, the resistance value between the power supply voltage terminal VDD and the first node ND10 may be set to a sum of resistance values of the first and second resistors R11 and R12. Alternatively, when the first voltage control test signal TM_DIV<1> has a logic "low" level and the second voltage control test signal TM_DIV<2> has a logic "high" level, the first PMOS transistor P10 may be turned off and the second PMOS transistor P11 may be turned on. Thus, a resistance value between the power supply voltage terminal VDD and the first node ND10 may be set to a resistance value of the second resistor R12.

The second voltage divider 121 may be configured to include third to seventh resistors R13, R14, R15, R16, and R17 which are connected in series. The third resistor R13 may be connected to the first node ND10 and the seventh resistor R17 may be connected to a second node ND11. That is, the second voltage divider 121 may be disposed between the first and second nodes ND10 and ND11 and may divide a voltage of the first node ND10 using the third to seventh resistors R13, R14, R15, R16, and R17 to generate the first to the fourth divided voltages DIV1, DIV2, DIV3, and DIV4. The first divided voltage DIV1 may correspond to a voltage induced at a node between the third and the fourth resistors R13 and R14, and the second divided voltage DIV2 may correspond to a voltage induced at a node between the fourth and the fifth resistors R14 and R15. Further, the third divided voltage DIV3 may correspond to a voltage induced at a node between the fifth and the sixth resistors R15 and R16, and the fourth divided voltage DIV4 may correspond to a voltage induced at a node between the sixth and the seventh resistors R16 and R17.

The third voltage divider 122 may be disposed between the second node ND11 and a ground voltage terminal VSS. That is, one terminal of the third voltage divider 122 may be electrically connected to the second node ND11 and another terminal of the third voltage divider 122 may be electrically connected to the ground voltage terminal VSS. Further, the third voltage divider 122 may be configured to include an eighth resistor R18, a ninth resistor R19, a first NMOS transistor N10, and a second NMOS transistor N11. The eighth and ninth resistors R18 and R19 may be connected in series between the second node ND11 and the ground voltage terminal VSS, and the first NMOS transistor N10 may be electrically connected to the ninth resistor R19 in parallel. Source and drain terminals of the second NMOS transistor N11 may be tied each other and may be electrically connected to the ground voltage terminal VSS. The third voltage divider 122 may turn on one of the first and second NMOS transistors N10 and N11 in response to a combination of logic levels of the first and second voltage control test signals TM_DIV<1:2>, thereby controlling a resistance value between the second node ND11 and the ground voltage terminal VSS. For example, when the first voltage control test signal TM_DIV<1> has a logic "high" level and the second voltage control test signal TM_DIV<2> has a logic "low" level, the first NMOS transistor N10 may be turned on and the second NMOS transistor N11 may be turned off. Thus, a resistance value between the second node ND11 and the ground voltage terminal VSS may be set to a resistance of the eighth resistor R18. Alternatively, when the first voltage control test signal TM_DIV<1> has a logic "low" level and the second voltage control test signal TM_DIV<2> has a logic "high" level, the first NMOS transistor N10 may be turned off and the second NMOS transistor N11 may be turned on. Thus, a resistance value between the second node ND11 and the ground voltage terminal VSS may be set to a sum of resistance values of the eighth and the ninth resistors R18 and R19. In some embodiments, a resistance value of the first resistor R11 may be equal to that of the ninth resistor R19.

A configuration of the selection transmitter 13 will be described more fully hereinafter with reference to FIG. 3.

Figure 3:
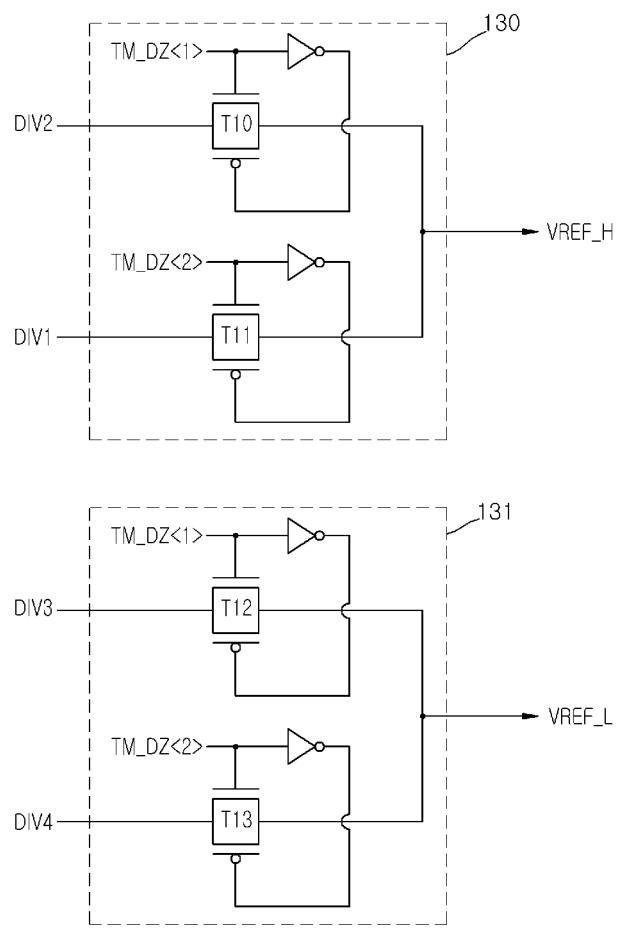
FIG. 3 is a circuit diagram illustrating a selection transmitter included in the internal voltage generation circuit shown in FIG. 1.

Referring to FIG. 3, the selection transmitter 13 may be configured to include a first selection transmitter 130 and a second selection transmitter 131. The first selection transmitter 130 may be configured to include a first transfer gate T10 and a second transfer gate T11, and the second selection transmitter 131 may be configured to include a third transfer gate T12 and a fourth transfer gate T13.

The first selection transmitter 130 may output one of the first and the second divided voltages DIV1 and DIV2 as the upper limit reference voltage VREF_H according to a combination of the logic levels of the first and second dead zone control test signals TM_DZ<1:2>. For example, when the first dead zone control test signal TM_DZ<1> has a logic "high" level and the second dead zone control test signal TM_DZ<2> has a logic "low" level, the first transfer gate T10 may be turned on and the second transfer gate T11 may be turned off. In such a case, the first selection transmitter 130 may output the second divided voltage DIV2 as the upper limit reference voltage VREF_H through the first transfer gate T10. Alternatively, when the first dead zone control test signal TM_DZ<1> has a logic "low" level and the second dead zone control test signal TM_DZ<2> has a logic "high" level, the second transfer gate T11 may be turned on and the first transfer gate T10 may be turned off. In such a case, the first selection transmitter 130 may output the first divided voltage DIV1 as the upper limit reference voltage VREF_H through the second transfer gate T11.

The second selection transmitter 131 may output one of the third and the fourth divided voltages DIV3 and DIV4 as the lower limit reference voltage VREF_L according to a combination of the logic levels of the first and the second dead zone control test signals TM_DZ<1:2>. For example, when the first dead zone control test signal TM_DZ<1> has a logic "high" level and the second dead zone control test signal TM_DZ<2> has a logic "low" level, the third transfer gate T12 may be turned on and the fourth transfer gate T13 may be turned off. In such a case, the second selection transmitter 131 may output the third divided voltage DIV3 as the lower limit reference voltage VREF_L through the third transfer gate T12. Alternatively, when the first dead zone control test signal TM_DZ<1> has a logic "low" level and the second dead zone control test signal TM_DZ<2> has a logic "high" level, the fourth transfer gate T13 may be turned on, and the third transfer gate T12 may be turned off. In such a case, the second selection transmitter 131 may output the fourth divided voltage DIV4 as the lower limit reference voltage VREF_L through the fourth transfer gate T13. The upper limit reference voltage VREF_H generated from the selection transmitter 13 may have a voltage level for pulling down the internal voltage VINT, and the lower limit reference voltage VREF_L generated from the selection transmitter 13 may have a voltage level for pulling up the internal voltage VINT. The upper limit reference voltage VREF_H may be set to be higher than the lower limit reference voltage VREF_L.

A configuration of the internal voltage generator 20 will be described more fully hereinafter with reference to FIG. 4.

Figure 4:
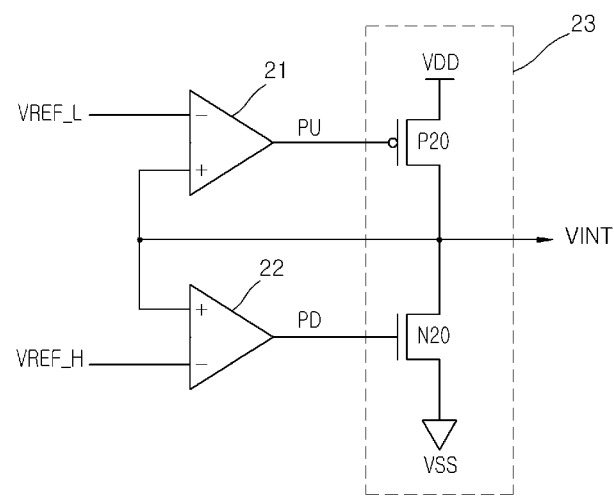
FIG. 4 is a circuit diagram illustrating an internal voltage generator included in the internal voltage generation circuit shown in FIG. 1.

Referring to FIG. 4, the internal voltage generator 20 may be configured to include a first comparator 21, a second comparator 22, and a driver 23.

The first comparator 21 may compare the internal voltage VINT with the lower limit reference voltage VREF_L to generate a pull-up signal PU. For example, when a level of the internal voltage VINT is lower than a level of the lower limit reference voltage VREF_L, the pull-up signal PU may be enabled to have a logic "low" level.

The second comparator 22 may compare the internal voltage VINT with the upper limit reference voltage VREF_H to generate a pull-down signal PD. For example, when a level of the internal voltage VINT is higher than a level of the upper limit reference voltage VREF_H, the pull-down signal PD may be enabled to have a logic "high" level.

The driver 23 may be configured to include a PMOS transistor P20 and an NOMS transistor N20 which are connected in series. A source terminal of the PMOS transistor P20 may be connected to the power supply voltage terminal VDD, and a source of the NMOS transistor N20 may be connected to the ground voltage terminal VSS. The driver 23 may receive the pull-up signal PU and the pull-down signal PD to drive the internal voltage VINT. The pull-up signal PU may be applied to a gate electrode of the PMOS transistor P20, and the pull-down signal PD may be applied to a gate electrode of the NMOS transistor N20. When the pull-up signal PU is enabled to have a logic "low" level, the PMOS transistor P20 may be turned on to pull up the internal voltage VINT. When the pull-down signal PD is enabled to have a logic "high" level, the NMOS transistor N20 may be turned on to pull down the internal voltage VINT. That is, the internal voltage generator 20 may pull down the internal voltage VINT when a level of the internal voltage VINT is higher than a level of the upper limit reference voltage VREF_H, and the internal voltage generator 20 may pull up the internal voltage VINT when a level of the internal voltage VINT is lower than a level of the lower limit reference voltage VREF_L. Further, the internal voltage VINT may not be driven any more when a level of the internal voltage VINT is within the range between the lower limit reference voltage VREF_L and the upper limit reference voltage VREF_H. Accordingly, the range between the lower limit reference voltage VREF_L and the upper limit reference voltage VREF_H may be referred to as a dead zone.

Figure 5:
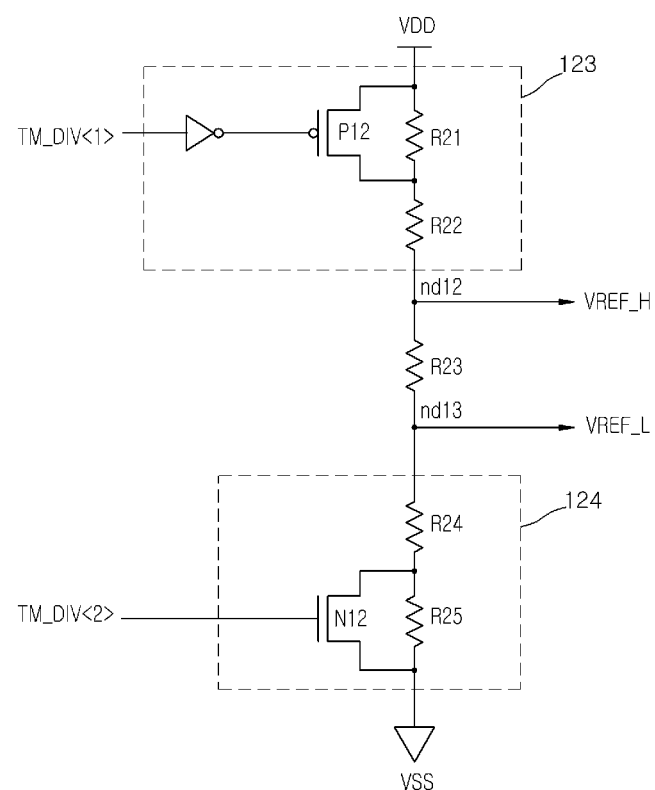
FIG. 5 is a circuit diagram illustrating a voltage divider included in an internal voltage generation circuit according to another example embodiment.

FIG. 5 is a circuit diagram illustrating a reference voltage divider included in an internal voltage generation circuit according to an embodiment of the present invention.

As illustrated in FIG. 5, a reference voltage divider 12a of an internal voltage generation circuit according to another example embodiment may be configured to include a first voltage divider 123, a third resistor R23, and a second voltage divider 124.

The first voltage divider 123 may be configured to include a first resistor R21 and a second resistor R22, which are connected in series between the power supply voltage terminal VDD and a first node ND12, and a PMOS transistor P12 connected in parallel to the first resistor R21. One terminal of the third resistor R23 may be connected to the first node ND12 and the other terminal of the third resistor R23 may be connected to a second node ND13. Further, the second voltage divider 124 may be configured to include a fourth resistor R24 and a fifth resistor R25, which are connected in series between the second node ND13 and the ground voltage terminal VSS, and an NMOS transistor N12 connected in parallel to the fifth resistor R25. The first voltage control test signal TM_DIV<1> may be applied to a gate electrode of the PMOS transistor P12 through an inverter, and the second voltage control test signal TM_DIV<2> may be directly applied to a gate electrode of the NMOS transistor N12.

When the first voltage control test signal TM_DIV<1> is enabled to have a logic "high" level, the PMOS transistor P12 may be turned on to control a resistance value between the power supply voltage terminal VDD and a first node ND12 and to generate the upper limit reference voltage VREF_H. For example, when the first voltage control test signal TM_DIV<1> is enabled to have a logic "high" level, the PMOS transistor P12 may be turned on. Thus, a resistance value between the power supply voltage terminal VDD and the first node ND12 may be set to a resistance value of the second resistor R22, and a voltage induced at the first node ND12 may be outputted as the upper limit reference voltage VREF_H. Alternatively, when the first voltage control test signal TM_DIV<1> is disabled to have a logic "low" level, the PMOS transistor P12 may be turned off. Thus, a resistance value between the power supply voltage terminal VDD and the first node ND12 may be set to a sum of resistance values of the first and second resistors R21 and R22, and a voltage induced at the first node ND12 may be outputted as the upper limit reference voltage VREF_H.

The third resistor R23 may generate a voltage difference between the first node ND12 and the second node ND13. That is, the third resistor R23 may generate a level difference between the upper limit reference voltage VREF_H and the lower limit reference voltage VREF_L.

When the second voltage control test signal TM_DIV<2> is enabled to have a logic "high" level, the NMOS transistor N12 may be turned on to control a resistance value between the second node ND13 and the ground voltage terminal VSS and to generate the lower limit reference voltage VREF_L. For example, when the second voltage control test signal TM_DIV<2> is enabled to have a logic "high" level, the NMOS transistor N12 may be turned on. Thus, a resistance value between the second node ND13 and the ground voltage terminal VSS may be set to a resistance value of the fourth resistor R24, and a voltage induced at the second node ND13 may be outputted as the lower limit reference voltage VREF_L. Alternatively, when the second voltage control test signal TM_DIV<2> is disabled to have a logic "low" level, the NMOS transistor N12 may be turned off. Thus, a resistance value between the second node ND13 and the ground voltage terminal VSS may be set to a sum of resistance values of the fourth and fifth resistors R24 and R25, and a voltage induced at the second node ND13 may be outputted as the lower limit reference voltage VREF_L.

As described above, the voltage divider of the internal voltage generation circuit according to the embodiments may control the voltage levels of the upper limit reference voltage VREF_H and the lower limit reference voltage VREF_L.

Hereinafter, an operation of the internal voltage generation circuit according to an embodiment of the present invention will be described to control a dead zone with reference to FIGS. 1 to 4.

Referring to FIG. 1, the test signal generator 11 of the reference voltage generator 10 may generate the first voltage control test signal TM_DIV<1> having a logic "low" level, the second voltage control test signal TM_DIV<2> having a logic "high" level, the first dead zone control test signal TM_DZ<1> having a logic "high" level, and the second dead zone control test signal TM_DZ<2> having a logic "low" level.

Referring to FIG. 2, the first voltage divider 120 of the voltage divider 12 may receive the first voltage control test signal TM_DIV<1> having a logic "low" level and the second voltage control test signal TM_DIV<2> having a logic "high" level, thereby turning off the first PMOS transistor P10 and turning on the second PMOS transistor P11. As a result, a resistance value between the power supply voltage terminal VDD and the first node ND10 may be set to a resistance value of the second resistor R12. The third voltage divider 122 may receive the first voltage control test signal TM_DIV<1> having a logic "low" level and the second voltage control test signal TM_DIV<2> having a logic "high" level to turn off the first NMOS transistor N10 and to turn on the second NMOS transistor N11. As a result, a resistance value between the second node ND11 and the ground voltage terminal VSS may be set to a sum of resistance values of the eighth and ninth resistors R18 and R19. The second voltage divider 121 may divide a voltage between the first and second nodes ND10 and ND11 using the third to seventh resistors R13~R17 to generate the first to fourth divided voltages DIV1~DIV4. If the first resistor R11 has the same resistance value as the ninth resistor R19, a total resistance between the power supply voltage terminal VDD and the ground voltage terminal VSS when the first voltage control test signal TM_DIV<1> has a logic "low" level and the second voltage control test signal TM_DIV<2> has a logic "high" level may be substantially equal to a total resistance between the power supply voltage terminal VDD and the ground voltage terminal VSS when the first voltage control test signal TM_DIV<1> has a logic "high" level and the second voltage control test signal TM_DIV<2> has a logic "low" level. That is, even though the logic levels of the first and second voltage control test signals TM_DIV<1:2> are simultaneously changed, a current flowing through the voltage divider 12 may not be changed. Thus, voltage levels of the first to fourth divided voltages DIV1~DIV4 generated when the first and second voltage control test signals TM_DIV<1:2> have respectively a logic "low" level and a logic "high" level may be shifted to be higher than voltage levels of the first to fourth divided voltages DIV1~DIV4 generated when the first and second voltage control test signals TM_DIV<1:2> have respectively a logic "high" level and a logic "low" level. Further, voltage differences between the first to fourth divided voltages DIV1~DIV4 when the first and second voltage control test signals TM_DIV<1:2> have respectively a logic "low" level and a logic "high" level may be substantially equal to voltage differences between the first to fourth divided voltages DIV1~DIV4 when the first and second voltage control test signals TM_DIV<1:2> have respectively a logic "high" level and a logic "low" level.

Referring to FIG. 3, the first selection transmitter 130 of the selection transmitter 13 may receive the first dead zone control test signal TM_DZ<1> having a logic "high" level and the second dead zone control test signal TM_DZ<2> having a logic "low" level, thereby turning on the first transfer gate T10 and turning off the second transfer gate T11. As a result, the first selection transmitter 130 may output the second divided voltage DIV2 as the upper limit reference voltage VREF_H. The second selection transmitter 131 may receive the first dead zone control test signal TM_DZ<1> having a logic "high" level and the second dead zone control test signal TM_DZ<2> having a logic "low" level, thereby turning on the third transfer gate T12 and turning off the fourth transfer gate T13. As a result, the second selection transmitter 131 may output the third divided voltage DIV3 as the lower limit reference voltage VREF_L. If the first and the second dead zone control test signals TM_DZ<1:2> have respectively a logic "low" level and a logic "high" level, the first selection transmitter 130 may output the first divided voltage DIV1 as the upper limit reference voltage VREF_H. The second selection transmitter 131 may output the fourth divided voltage DIV4 as the lower limit reference voltage VREF_L. That is, a voltage difference (e.g., a dead zone window) between the upper and lower limit reference voltages VREF_H and VREF_L may be reduced when the first and second dead zone control test signals TM_DZ<1:2> have respectively a logic "high" level and a logic "low" level.

Referring to FIG. 4, the first comparator 21 of the internal voltage generator 20 may compare the internal voltage VINT with the lower limit reference voltage VREF_L to generate the pull-up signal PU having a logic "high" level. The second comparator 22 may compare the internal voltage VINT with the upper limit reference voltage VREF_H to generate the pull-down signal PD having a logic "low" level. The driver 23 may receive the pull-up signal PU having a logic "high" level and the pull-down signal PD having a logic "low" level, thereby turning off the PMOS transistor P20 and the NMOS transistor N20. As a result, the internal voltage VINT may not be driven. That is, since the internal voltage VINT has a level between the upper and lower limit reference voltages VREF_H and VREF_L, the dead zone window may be reduced.

According to the embodiments set forth above, node voltages of a voltage divider may be varied according to a combination of logic levels of test signals. Thus, a dead zone may be controlled and may be set to have an appropriate window.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An internal voltage generation circuit, the circuit comprising:
   a test signal generator configured to generate voltage control test signals for adjusting resistance values used in division of a power supply voltage and to generate dead zone control test signals for setting a dead zone window that an internal voltage is not driven;
   a voltage divider configured to divide the power supply voltage using the resistance values which are set by the voltage control test signals and to generate divided voltages;
   a selection transmitter configured to output one of the divided voltages as an upper limit reference voltage and to output another one of the divided voltages as a lower limit reference voltage in response to the dead zone control test signals; and
   an internal voltage generator configured to generate an internal voltage which is driven according to the levels of the upper and lower limit reference voltages.

2. The circuit of claim 1, wherein the upper and lower limit reference voltages are voltage levels which are obtained by dividing a power supply voltage according to the adjusted resistance values.

3. The circuit of claim 1, wherein the upper limit reference voltage is higher than the lower limit reference voltage.

4. The circuit of claim 1, wherein the internal voltage is not driven when the internal voltage has a level between the upper limit reference voltage and the lower limit reference voltage.

5. The circuit of claim 1, wherein the internal voltage is pulled down when the internal voltage is higher than the upper limit reference voltage and the internal voltage is pulled up when the internal voltage is lower than the lower limit reference voltage.

6. The circuit of claim 1, wherein the voltage divider includes:
   a first voltage divider disposed between a power supply voltage terminal outputting the power supply voltage and a first node and configured to control one of the resistance values in response to the voltage control test signals;
   a second voltage divider disposed between the first node and a second node, the second voltage divider being configured to divide a voltage between the first and second nodes to generate the divided voltages; and
   a third voltage divider disposed between the second node and a ground voltage terminal and configured to control another one of the resistance values in response to the voltage control test signals,
   wherein the divided voltages include first to fourth divided voltages.

7. The circuit of claim 6, wherein the selection transmitter includes:
   a first selection transmitter configured to output one of the first and second divided voltages as the upper limit reference voltage in response to the dead zone control test signals; and
   a second selection transmitter configured to output one of the third and fourth divided voltages as the lower limit reference voltage in response to the dead zone control test signals.

8. The circuit of claim 1, wherein the internal voltage generator includes:
   a first comparator configured to compare the internal voltage with the lower limit reference voltage to generate a pull-up signal;
   a second comparator configured to compare the internal voltage with the upper limit reference voltage to generate a pull-down signal; and
   a driver configured to drive the internal voltage in response to the pull-up signal and the pull-down signal.

9. An internal voltage generation circuit, the circuit comprising:
   a test signal generator configured to generate first and second voltage control test signals for setting resistance values used in division of a power supply voltage and to generate first and second dead zone control test signals for setting a dead zone window in which an internal voltage is not driven;
   a voltage divider configured to divide the power supply voltage using the resistance values set by the first and second voltage control test signals and to generate first to fourth divided voltages; and
   a selection transmitter configured to output one of the first and second divided voltages as an upper limit reference voltage and to output one of the third and fourth divided voltages as a lower limit reference voltage, in response to the first and second dead zone control test signals.

10. The circuit of claim 9, wherein the internal voltage is not driven when the internal voltage has a level between the upper limit reference voltage and the lower limit reference voltage.

11. The circuit of claim 9, wherein the upper limit reference voltage is higher than the lower limit reference voltage.

12. The circuit of claim 9, wherein the internal voltage is pulled down when the internal voltage is higher than the upper limit reference voltage and the internal voltage is pulled up when the internal voltage is lower than the lower limit reference voltage.

13. The circuit of claim 9, wherein the voltage divider includes:
   a first voltage divider disposed between a power supply voltage terminal outputting the power supply voltage and a first node and configured to control one of the resistance values in response to the first and second voltage control test signals;
   a second voltage divider disposed between the first node and a second node, the second voltage divider being configured to divide a voltage between the first and second nodes to generate the first to fourth divided voltages; and a third voltage divider disposed between the second node and a ground voltage terminal and configured to control another one of the resistance values in response to the first and second voltage control test signals.

14. The circuit of claim 13, wherein the selection transmitter includes:
a first selection transmitter configured to output one of the first and second divided voltages as the upper limit reference voltage in response to the first and second dead zone control test signals; and
a second selection transmitter configured to output one of the third and fourth divided voltages as the lower limit reference voltage in response to the first and second dead zone control test signals.

15. The circuit of claim 9, wherein the internal voltage generator includes:
a first comparator configured to compare the internal voltage with the lower limit reference voltage to generate a pull-up signal;
a second comparator configured to compare the internal voltage with the upper limit reference voltage to generate a pull-down signal; and
a driver configured to drive the internal voltage in response to the pull-up signal and the pull-down signal.

16. An internal voltage generation system comprising:
an internal voltage generator configured to generate an internal voltage that is driven to a level of an upper limit reference voltage and a lower limit reference voltage;
a selection transmitter configured to output the upper limit reference voltage and the lower limit reference voltage;
a test signal generator configured to generate voltage control test signals to adjust one or more resistance values used to divide a power supply voltage and to generate dead zone control signals to set a dead zone window in which the internal voltage is not driven; and
a voltage divider configured to divide the power supply voltage to generate a divided voltage.

17. The system of claim 16, the system further comprising:
a first selection transmitter to output a first divided voltage or a second divided voltage as the upper limit reference voltage;
a second selection transmitter to output a third divided voltage or a fourth divided voltage as the lower limit reference voltage;
a first voltage divider to turn on a first transistor or a second transistor in response to receiving a logic high level test signal or a logic low level test signal; and
a second voltage divider configured to generate the first divided voltage, the second divided voltage, the third divided voltage, and the fourth divided voltage.

18. The system of claim 16, the system further comprising:
a first comparator to compare the internal voltage with the lower limit reference voltage; and
a second comparator to compare the internal voltage with the upper limit reference voltage.

* * * * *